US011500268B2

(12) United States Patent
Ichihara

(10) Patent No.: US 11,500,268 B2
(45) Date of Patent: Nov. 15, 2022

(54) LIGHTING DEVICE THAT SUPPRESSES EXCESSIVE TEMPERATURE RISE OF LIGHT EMISSION SECTION, METHOD OF CONTROLLING SAME, AND IMAGE CAPTURE APPARATUS

(71) Applicant: CANON KABUSHIKI KAISHA, Tokyo (JP)

(72) Inventor: Yoshiro Ichihara, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 364 days.

(21) Appl. No.: 16/789,958

(22) Filed: Feb. 13, 2020

(65) Prior Publication Data

US 2020/0264493 A1 Aug. 20, 2020

(30) Foreign Application Priority Data

Feb. 18, 2019 (JP) .............................. JP2019-026683

(51) Int. Cl.
*H04N 5/225* (2006.01)
*G03B 15/05* (2021.01)
*H05K 7/20* (2006.01)

(52) U.S. Cl.
CPC ........... *G03B 15/05* (2013.01); *H04N 5/2256* (2013.01); *H05K 7/20172* (2013.01); *H05K 7/20209* (2013.01); *G03B 2215/0503* (2013.01)

(58) Field of Classification Search
CPC .................................................. H04N 5/2256
USPC ........................................................ 348/371
See application file for complete search history.

(56) References Cited

U.S. PATENT DOCUMENTS

2014/0104809 A1 4/2014 Shum
2017/0257541 A1* 9/2017 Saito ..................... H04N 5/2256
2018/0283643 A1* 10/2018 Fukui ...................... F21V 23/02

FOREIGN PATENT DOCUMENTS

| CN | 1314611 A | 9/2001 |
| CN | 101932166 A | 12/2010 |
| CN | 201689263 U | 12/2010 |
| CN | 202032342 U | 11/2011 |
| CN | 104006368 A | 8/2014 |
| CN | 104965376 A | 10/2015 |
| CN | 205331983 U | 6/2016 |

(Continued)

OTHER PUBLICATIONS

The above foreign patent documents were cited in a Feb. 25, 2022 Chinese Office Action, a copy of which is enclosed with an English Translation, that issued in Chinese Patent Application No. 202010096650.6.

(Continued)

*Primary Examiner* — Joel W Fosselman
(74) *Attorney, Agent, or Firm* — Cowan, Liebowitz & Latman, P.C.

(57) ABSTRACT

A lighting device capable of suppressing an excessive temperature rise of a light emission section even when a fan is incapable of normal rotation. The light emission section emits light for illuminating an object. The fan cools the light emission section. A motor driving section drives the fan for rotation. A strobe microcomputer determines whether or not the motor driving section is abnormal, and controls a light emission interval of the light emission section in continuous light emission, based a result of the determination.

14 Claims, 12 Drawing Sheets

(56) References Cited

FOREIGN PATENT DOCUMENTS

| | | | |
|---|---|---|---|
| CN | 206178316 | U | 5/2017 |
| CN | 107155069 | A | 9/2017 |
| CN | 207621803 | U | 7/2018 |
| CN | 109041383 | A | 12/2018 |
| JP | H09-230446 | A | 9/1997 |
| JP | H11-149110 | A | 6/1999 |
| JP | 2001-228511 | A | 8/2001 |
| JP | 2003-255448 | A | 9/2003 |
| JP | 2012-032822 | A | 2/2012 |
| JP | 5246310 | B2 | 7/2013 |
| TW | 200843275 | A | 11/2008 |

OTHER PUBLICATIONS

The above documents were cited in a Jul. 23, 2021 Chinese Office Action, a copy of which is enclosed with an English Translation, that issued in Chinese Patent Application No. 202010096650.6.

* cited by examiner

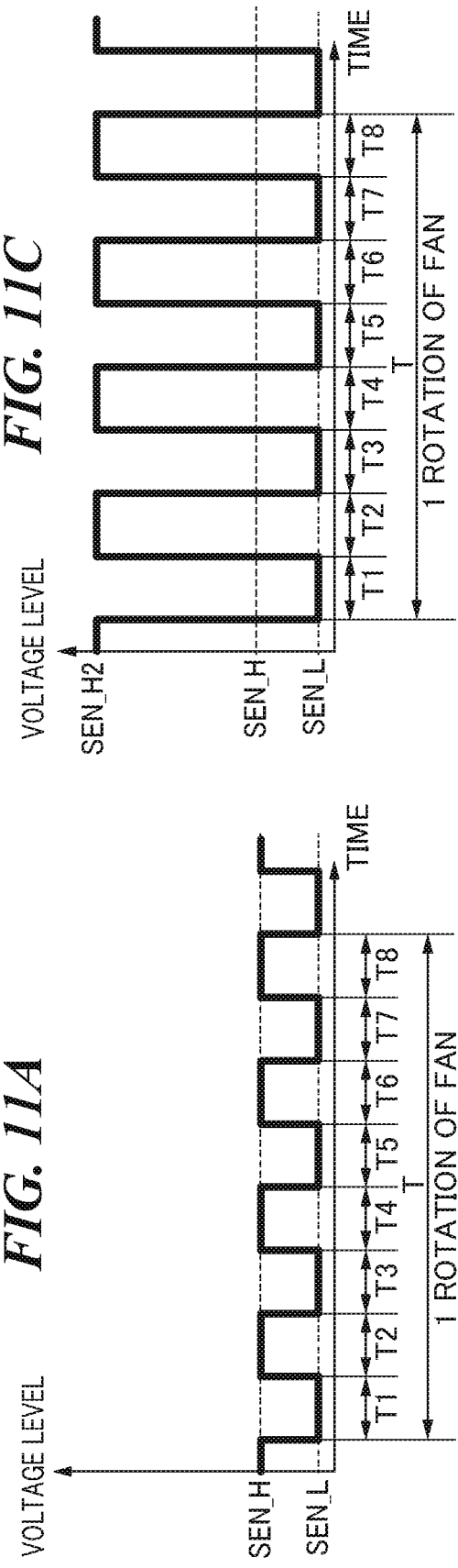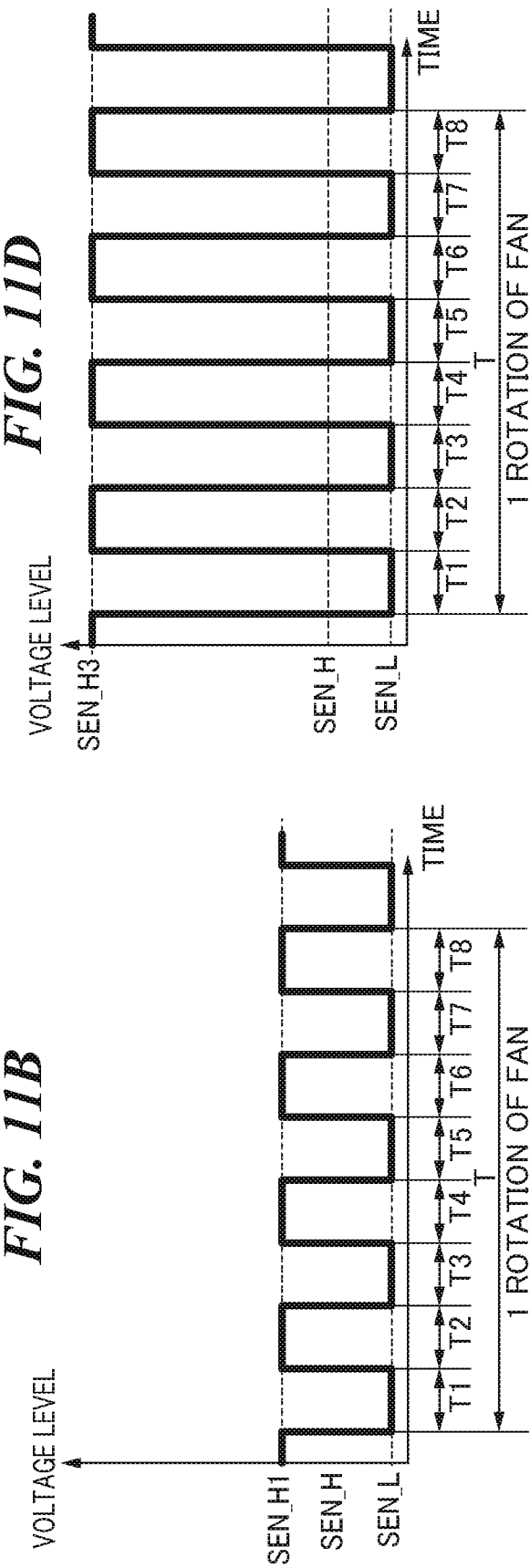

LIGHTING DEVICE THAT SUPPRESSES EXCESSIVE TEMPERATURE RISE OF LIGHT EMISSION SECTION, METHOD OF CONTROLLING SAME, AND IMAGE CAPTURE APPARATUS

BACKGROUND OF THE INVENTION

Field of the Invention

The present invention relates to a lighting device including a light emission section that emits light for illuminating an object and a fan for cooling the light emission section, and a method of controlling the same, and an image capture apparatus.

Description of the Related Art

A lighting device, such as a strobe device, used in an image capture apparatus has a light emission section including a xenon tube, a reflection umbrella, and a Fresnel panel. The temperature of the inside of the light emission section is increased by continuous light emission operation, and hence there is a fear that members as components of the light emission section suffer damage, such as deformation, due to the temperature rise of the light emission section. To avoid this damage, there has been proposed a lighting device provided with a fan for cooling the light emission section.

For example, Japanese Patent No. 5246310 discloses a lighting device including a shielding wall that is provided between a discharge tube and a Fresnel panel and allows light to transmit therethrough, and a plurality of vents formed in a wall of a casing, for communication between space toward the Fresnel panel inside the casing and space outside the casing. The fan sends outside air through the vents to thereby cool the Fresnel panel.

However, in the lighting device disclosed in Japanese Patent No. 5246310, even when such a problem that the fan does not normally rotate has occurred due to expiration of service life or failure of the fan, light emission from the light emission section is performed as usual, and hence there is a fear that the temperature of the components of the light emission section excessively rises since the light emission section is not cooled.

SUMMARY OF THE INVENTION

The present invention provides a lighting device capable of suppressing an excessive temperature rise of a light emission section even when a fan becomes incapable of normal rotation, a method of controlling the same, and an image capture apparatus including the lighting device.

In a first aspect of the present invention, there is provided a lighting device comprising a light emission section configured to emit light for illuminating an object, a fan configured to cool the light emission section, a drive unit configured to include a motor and drive the fan for rotation, at least one memory that stores a set of instructions, and at least one processor that executes the instructions, the instructions, when executed, causing the lighting device to perform operations comprising determining whether or not the drive unit is abnormal, and controlling a light emission interval of the light emission section in continuous light emission, based a result of said determining.

In a second aspect of the present invention, there is provided an image capture apparatus including a lighting device, and an image capture section having an image capture function, the lighting device comprising a light emission section configured to emit light for illuminating an object, a fan configured to cool the light emission section, a drive unit configured to include a motor and drive the fan for rotation, at least one memory that stores a set of instructions, and at least one processor that executes the instructions, the instructions, when executed, causing the lighting device to perform operations comprising determining whether or not the drive unit is abnormal, and controlling a light emission interval of the light emission section in continuous light emission, based a result of said determining.

In a third aspect of the present invention, there is provided a method of controlling a lighting device including a light emission section configured to emit light for illuminating an object, a fan configured to cool the light emission section, and a drive unit configured to include a motor and drive the fan for rotation, comprising determining whether or not the drive unit is abnormal, and controlling a light emission interval of the light emission section in continuous light emission, based a result of said determining.

According to the present invention, it is possible to suppress an excessive temperature rise of the light emission section even when the fan is incapable of normal rotation.

Further features of the present invention will become apparent from the following description of exemplary embodiments (with reference to the attached drawings)

BRIEF DESCRIPTION OF THE DRAWINGS

FIGS. 11A to 11D are diagrams each showing changes in the level of a voltage input to the strobe microcomputer.

DESCRIPTION OF THE EMBODIMENTS

The present invention will now be described in detail below with reference to the accompanying drawings showing embodiments thereof.

Figure 1:
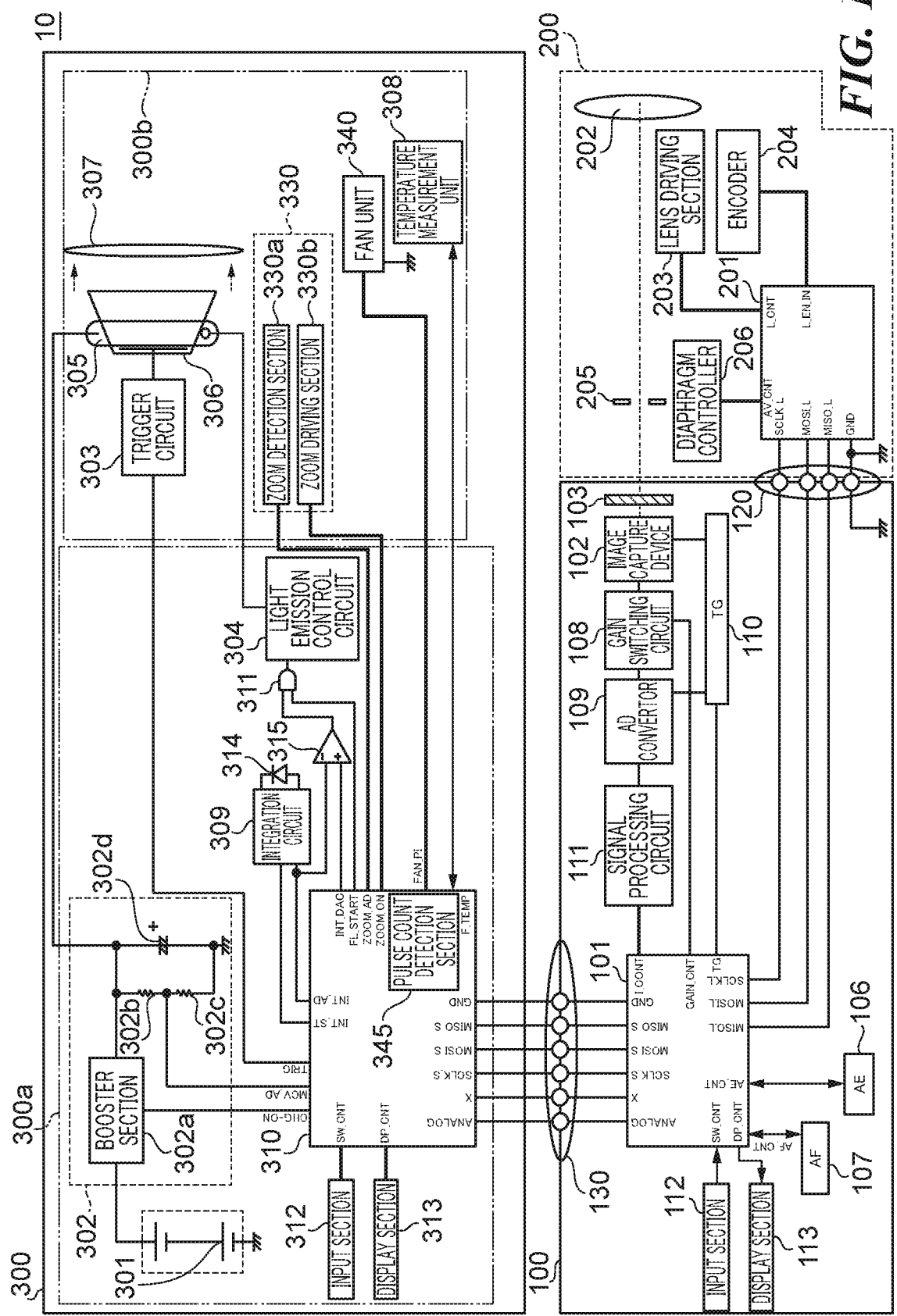
FIG. 1 is a schematic block diagram of an image capture system including a lighting device according to a first embodiment of the present invention.
Figure 2:
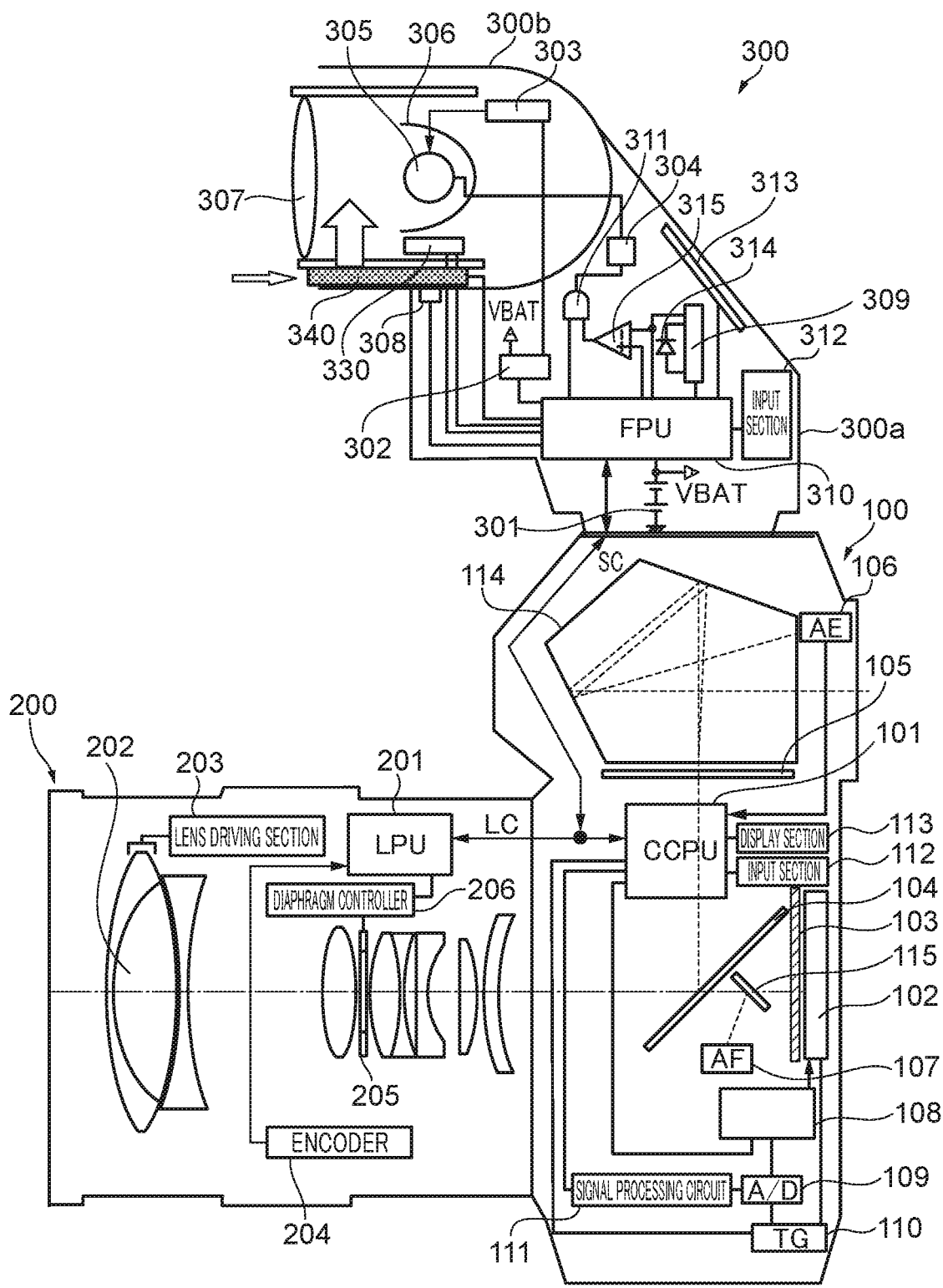
FIG. 2 is a schematic cross-sectional view of the image capture system.

FIG. 1 is a schematic block diagram of an image capture system including a lighting device according to a first embodiment of the present invention. FIG. 2 is a schematic cross-sectional view of the image capture system, denoted by reference numeral 10. Note that the same component elements in FIGS. 1 and 2 are denoted by the same reference numerals. Further, some of the component elements appear in FIG. 1, but not in FIG. 2, and others of the component elements appear in FIG. 2, but not in FIG. 1.

The image capture system 10 includes a camera body 100 which is an image capture section having an image capture function, a lens unit 200 attached to the camera body 100, and a lighting device 300 which is a strobe device attached to the camera body 100. The lighting device 300 is removably mounted on the camera body 100, The lens unit 200 may be fixed to (integrated with) the camera body 100, or may be removably attached to the camera body 100.

The camera body 100 is provided with a microcomputer (Camera Central Processing Unit: hereinafter referred to as the camera microcomputer) 101. The camera microcomputer 101 controls the overall operation of the camera body 100. The camera microcomputer 101 is a microcomputer-incorporated one-chip IC circuit. The camera microcomputer 101 includes a CPU, a ROM, a RAM, an input/output control circuit (I/O control circuit), a multiplexer, a timer circuit, an EEPROM, an analog-to-digital converter, a digital-to-analog converter, none of which are specifically shown, and so forth. The camera microcomputer 101 controls the image capture system 10 according to programs (software), and performs determination of various conditions.

An image capture device 102 is implemented by a CCD, a CMOS sensor or the like, and includes an infrared cut filter, a lowpass filter, none of which are specifically shown, etc. An object image is formed on the image capture device 102 through a lens group 202, referred to hereinafter. A shutter 103 is moved between a position for shielding the image capture device 102 from light and a position for exposing the image capture device 102 to light. A main mirror (half mirror) 104 is moved between a position inserted into an optical path (shooting optical path) of light entering the image capture device 102 through the lens group 202, for reflecting part of the incident light to form an image on a focusing plate 105 and a position retracted from the optical path. When shooting is not performed, the main minor (half mirror) 104 reflects light incident through the lens group 202 to form an image on the focusing plate 105. A photographer can confirm the image projected on the focusing plate 105 through an optical viewfinder, not shown.

A photometry circuit (AE circuit) 106 has a photometry sensor, not shown, incorporated therein, and performs photometry in each of a plurality of areas formed by dividing a whole area of an object. An object image formed on the focusing plate 105 enters the photometry sensor of the photometry circuit 106 through a pentaprism 114. A focus detection circuit (AF circuit) 107 includes a ranging sensor, not shown, which has a plurality of ranging points, and outputs focus information, such as a defocus amount at each ranging point.

A gain switching circuit 108 is a circuit for switching a gain for amplifying electrical signals output from the image capture device 102. Switching of the gain is performed by the camera microcomputer 101 according to a shooting condition, a user operation, etc. An analog-to-digital convertor 109 converts analog signals which are output from the image capture device 102 and amplified, to digital signals. A timing generator (TG) 110 synchronizes the input of analog signals from the image capture device 102 and the timing of conversion performed by the analog-to-digital convertor 109 with each other. A signal processing circuit 111 performs signal processing on image data converted to digital signals by the analog-to-digital convertor 109.

Communication lines LC and SC are interfaces between the camera body 100, and the lens unit 200 and the lighting device 300, respectively. For example, the camera body 100, the lens unit 200, and the lighting device 300 exchange data, and transmit commands to each other, using the camera microcomputer 101 as the host. The communication lines LC and SC have terminals 120 and 130, respectively.

The terminal 120 is connected to a microcomputer LPU 201, referred to hereinafter, and has an SCLK_L terminal, a MOSI_L terminal, a MISO_L terminal, and a GND terminal. The SCLK_L terminal is a terminal for synchronizing communication between the camera body 100 and the lens unit 200. The MOSI_L terminal is a terminal for transmitting data from the camera body 100 to the lens unit 200. The MISO_L terminal is a terminal for receiving data transmitted from the lens unit 200 to the camera body 100. The camera body 100 and the lens unit 200 are connected to the GND terminal.

The terminal 130 is connected to the camera microcomputer 101. The terminal 130 is a terminal, such as an accessory shoe, for attaching/removing a lighting device or a camera accessory device to and from the camera body 100. The terminal 130 has an SCLK_S terminal, a MOSI_S terminal, a MISO_S terminal, and a GND terminal. The SCLK_S terminal is a terminal for synchronizing communication between the camera body 100 and the lighting device 300. The MOSI_S terminal is a terminal for transmitting data from the camera body 100 to the lighting device 300. The MISO_S terminal is a terminal for receiving data transmitted from the lighting device 300 to the camera body 100. The camera body 100 and the lighting device 300 are connected to the GND terminal.

An input section 112 has an operation section including a power switch, a release switch, set buttons, none of which are specifically shown, and so forth. The camera microcomputer 101 performs various processing according to an input operation on the input section 112. When the release switch is half-pressed as a first stage operation, a first release switch SW1 is turned on, and the camera microcomputer 101 starts shooting preparation operations, including a focus adjustment operation and a photometry operation. Further, when the release switch is fully-pressed as a second stage operation, a second release switch SW2 is turned on, and the camera microcomputer 101 starts shooting operations, including an exposure operation and development processing. Further, a user can make various settings for the lighting device 300 by operating the set buttons provided on the input section 112.

The set shooting mode of the camera, other shooting information, and so forth, are displayed on a display section 113. The display section 113 has e.g. a liquid crystal display device and a light emission element, neither of which is specifically shown. The pentaprism 114 guides an object image formed on the focusing plate 105 to the photometry sensor of the photometry circuit 106 and the optical viewfinder (neither of which is shown). A sub mirror 115 guides light transmitted through the main mirror 104 to the ranging sensor (not shown) of the focus detection circuit 107.

Next, the construction and operation of the lens unit 200 will be described. The lens unit 200 includes the microcomputer LPU (hereinafter referred to as the lens microcomputer) 201. The lens microcomputer 201 controls the components of the lens unit 200. The lens microcomputer 201 is e.g. a microcomputer-incorporated one-chip IC circuit including a CPU, a ROM, a RAM, an input/output control circuit (I/O control circuit), a multiplexer, a timer circuit, an EEPROM, an analog-to-digital converter, and a digital-to-analog converter, none of which are specifically shown.

The lens unit 200 includes the lens group 202 having a plurality of lenses, and at least a focus lens is included in the lens group 202. A lens driving section 203 moves lenses included in the lens group 202 along an optical axis. The camera microcomputer 101 calculates a driving amount to be set when driving the lens group 202, based on a detection output of the focus detection circuit 107, and transmits the driving amount to the lens microcomputer 201.

An encoder 204 detects a position of the lens group 202 during driving of the lens group 202. The lens microcomputer 201 controls the lens driving section 203 according to the driving amount calculated by the camera microcomputer 101. Then, the lens microcomputer 201 adjusts the focus by controlling driving of the lens group 202 by consulting the position indicated by an output from the encoder 204. Further, the lens microcomputer 201 can calculate a distance at which an in-focus state is achieved, based on the calculated driving amount. When the in-focus state is achieved again after adjusting the focus, the lens microcomputer 201 can calculate a deviation of the distance of the object, based on the driving amount. A diaphragm 205 adjusts the amount of light passing therethrough. The diaphragm 205 is controlled by the lens microcomputer 201 via a diaphragm controller 206.

Next, the construction of the lighting device 300 will be described. The lighting device 300 includes a main body 300a which is removably attached to the camera body 100 and a light emission section 300b which is held rotatable in a vertical direction and a lateral direction with respect to the main body 300a. The lighting device 300 includes a microcomputer (FPU: the strobe microcomputer) 310. The strobe microcomputer 310 controls the overall operation of the lighting device 300. The strobe microcomputer 310 is e.g. a microcomputer-incorporated one-chip IC circuit including a CPU, a ROM, a RAM, an input/output control circuit (I/O control circuit), a multiplexer, a timer circuit, an EEPROM, an analog-to-digital converter, and a digital-to-analog converter, none of which are specifically shown.

A battery 301 functions as a power source (VBAT) of the lighting device 300. A booster circuit 302 includes a booster section 302a, resistors 302b and 302c, and a main capacitor 302d. The booster circuit 302 boosts the voltage of the battery 301 to several hundred volts using the booster section 302a, and accumulates electrical energy for emitting light, in the main capacitor 302d. The charging voltage of the main capacitor 302d is divided by the resistors 302b and 302c, and the divided voltage is input to an analog-to-digital conversion terminal of the strobe microcomputer 310. A trigger circuit 303 applies a pulse voltage to the discharge tube 305 for exciting the same. A light emission control circuit 304 controls start and stop of light emission from the discharge tube 305. The discharge tube 305 is excited by receiving a pulse voltage of several kilovolts applied from the trigger circuit 303, and emits light using the electrical energy charged in the main capacitor 302d.

The light emission section 300b includes the discharge tube 305, a reflection umbrella 306, and a zoom optical system 307, as the main components, and emits light for illuminating an object. The irradiation range of the light emission section 300b is changed in accordance with movement of the zoom optical system 307. The reflection umbrella 306 reflects light emitted from the discharge tube 305 and guides the reflected light in a predetermined direction. The zoom optical system 307 including an optical panel, not shown, and so forth is held such that the position thereof relative to the discharge tube 305 is changeable. By changing the relative positions of the discharge tube 305 and the zoom optical system 307, it is possible to change the guide number according to a change of the irradiation range of the lighting device 300.

A temperature measurement unit 308 detects a temperature of a fan unit 340 for cooling the light emission section 300b. The temperature measurement unit 308 is connected to the strobe microcomputer 310 by a signal line. For example, the temperature measurement unit 308 monitors the temperature of the fan at fixed intervals, and the strobe microcomputer 310 determines whether or not the temperature of the fan has increased to an abnormal temperature. If it is determined that the temperature of the fan has increased to an abnormal temperature, the strobe microcomputer 310 performs an operation for stopping the fan.

A photo diode 314 is a sensor that receives light emitted from the discharge tube 305 directly or via a glass fiber or the like and outputs a detection output (electrical current) corresponding to the received light amount. An integration circuit 309 integrates an electrical current output from the photo diode 314. An output (integration output) from the integration circuit 309 is input to an inverting input terminal of a comparator 315 and an analog-to-digital convertor terminal of the strobe microcomputer 310. A non-inverting input terminal of the comparator 315 is connected to a digital-to-analog convertor output terminal of the strobe microcomputer 310, and an output terminal of the comparator 315 is connected to one of input terminals of an AND gate 311. The other of the input terminals of the AND gate 311 is connected to a light emission control terminal of the strobe microcomputer 310 and an output terminal of the AND gate 311 is connected to the light emission control circuit 304.

An input section 312 has an operation section including a power switch, a mode setting switch for setting the operation mode of the lighting device 300, and set buttons for setting various parameters, none of which are specifically shown. The strobe microcomputer 310 performs various processing processes according to an input to the input section 312. A display section 313 displays information indicating the state of the lighting device 300. The display section 313 is provided with a liquid crystal device and a light emission element, neither of which is shown.

A zoom driving circuit 330 includes a zoom detection section 330a and a zoom driving section 330b. The zoom detection section 330a detects the relative positions of the discharge tube 305 and the zoom optical system 307, using an encoder or the like. The zoom driving section 330b moves the zoom optical system 307 using a motor. The strobe microcomputer 310 acquires focal distance information from the lens microcomputer 201 via the camera microcomputer 101 and calculates a driving amount of the zoom optical system 307 according to the acquired focal distance information.

Figure 3:
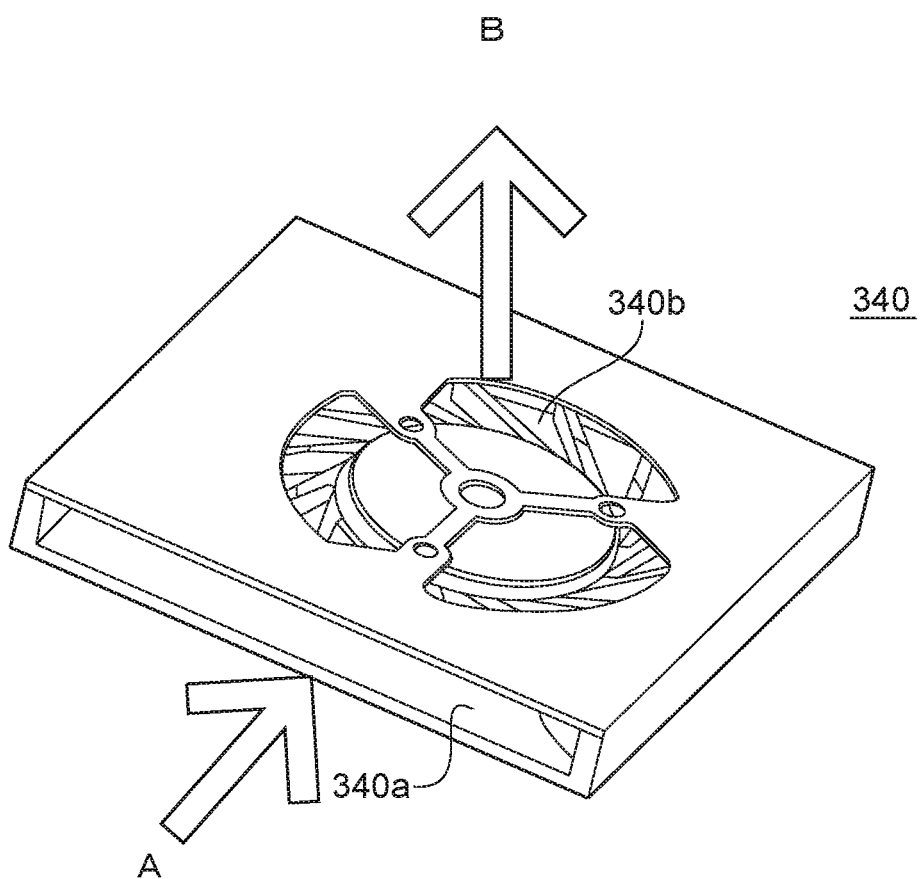
FIG. 3 is a perspective view of a fan unit.

FIG. 3 is a perspective view of the fan unit 340. The fan unit 340 has a structure in which outside air is sucked from a suction port 340a as indicated by an arrow A and is discharged from a discharge port 340b as indicated by an arrow B. The fan unit 340 cools the inside of the light emission section 300b. In the fan unit 340, wind is generated by a propeller 342 (fan) driven for rotation by a motor driving section 343 (see FIG. 4) as a drive unit, and the wind cools the light emission section 300b.

Figure 4:
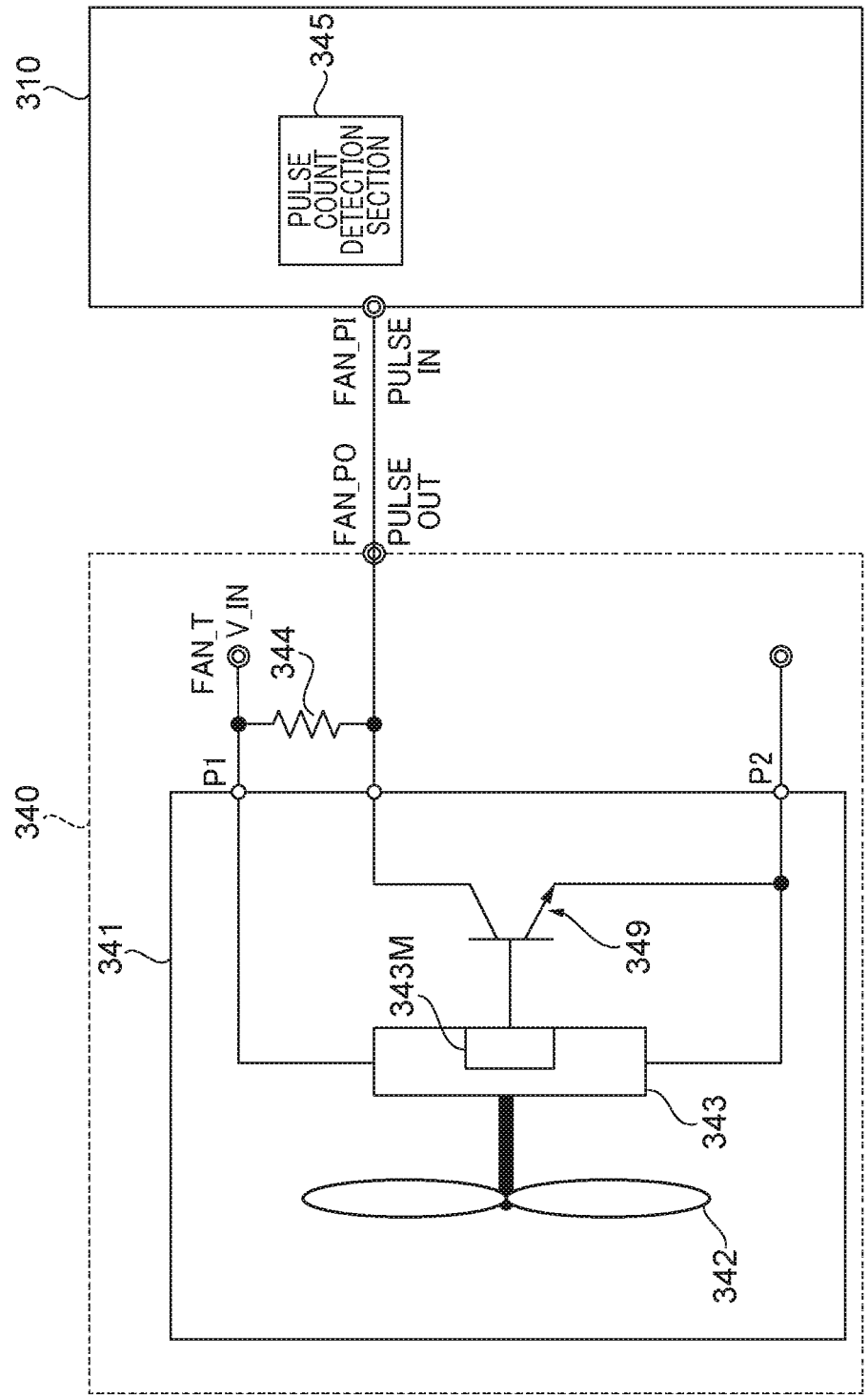
FIG. 4 is a circuit block diagram of the fan unit, shown together with a strobe microcomputer, in block diagram, of the lighting device.

FIG. 4 is a circuit block diagram of the fan unit 340, shown together with the strobe microcomputer 310, in block diagram, of the lighting device 300. The fan unit 340 has a fan unit main body 341. The fan unit main body 341 has the propeller 342, the motor driving section 343, and an NPN transistor 349 that outputs a pulse signal in accordance with rotation of a motor 343M of the motor driving section 343, as the main components. The output of the NPN transistor 349 is of an open collector type. The motor driving section 343 includes the motor 343M and is connected to terminals P1 and P2, etc. The terminal P1 is connected to a power terminal to which a power supply is input and a terminal FAN_T, both of which are used for driving the propeller 342 for rotation. Connection of the power supply and the terminal FAN_T is controlled by the strobe microcomputer 310, The power supply V_IN is connected to a positive electrode side of the battery 301 e.g. via a switch (not shown) controlled by the strobe microcomputer 310, and the terminal P2 is connected to a negative electrode side of the battery 301.

The NPN transistor 349 outputs a pulse signal in accordance with rotation of the motor 343M of the motor driving section 343. A pull-up resistor 344 outputs a rotation pulse signal to a terminal FAN_PO in accordance with a pulse signal (ON/OFF) output from the NPN transistor 349. This rotation pulse signal is input to a terminal FAN_PI of the strobe microcomputer 310. A pulse count detection section 345 of the strobe microcomputer 310 counts the number of pulses per unit time based on the input rotation pulse signal, and calculates the number of rotations of the motor 343M of the motor driving section 343 (or the propeller 342) based on the counted number of pulses. The function of the pulse count detection section 345 is realized by cooperation of the CPU, the ROM, the RAM, etc. included in the strobe microcomputer 310.

FIGS. 5A to 5D are diagrams each showing changes in the rotation pulse signal input to the strobe microcomputer 310. In each diagram, the vertical axis represents a pulse voltage (output voltage of the terminal FAN_PO) which is the rotation pulse signal and the horizontal axis represents time. The pulse voltage changes within a range of amplitude from a value VOL to a value VOH. The number of rotations of the motor 343M of the motor driving section 343 per unit time is hereafter referred to as the "motor rotation number". FIGS. 5A, 5B, 5C, and 5D show pulse voltages when the motor rotation number is 1, ¾, ½, and ¼, respectively. The motor rotation number is used as an index for determining whether or not the motor driving section 343 is abnormal and measuring the degree of abnormality.

When the motor driving section 343 is in the normal state, as shown in FIG. 5A, a time required for the motor 343M of the motor driving section 343 to perform one rotation is represented by a time T. The duration of one pulse is represented by each of times T1 to T8, and ideally, the times T1 to T8 are equal to each other. Note that although duty is designed to be 50%, in actuality, the duration of one pulse changes due to variation. At normal time, four pulses are generated during the time T over which the motor 343M of the motor driving section 343 performs one rotation.

FIG. 5B shows a state in which the motor rotation number is reduced to ¾. Therefore, three pulses are generated during the time T over which the motor 343M of the motor driving section 343 performs one rotation. Similarly, FIG. 5C shows a state in which the motor rotation number is reduced to ½, and two pulses are generated during the time T over which the motor driving section 343 performs one rotation. FIG. 5D shows a state in which the motor rotation number is reduced to ¼, and one pulse is generated during the time T over which the motor driving section 343 performs one rotation. However, as will be referred to hereinafter, FIG. 5D shows a state in which the fan is assumed to be in failure. The pulse count detection section 345 counts the number of pulses to thereby detect the motor rotation number continuously or at fixed intervals, and stores the detected motor rotation number e.g. in the RAM.

Figure 6:
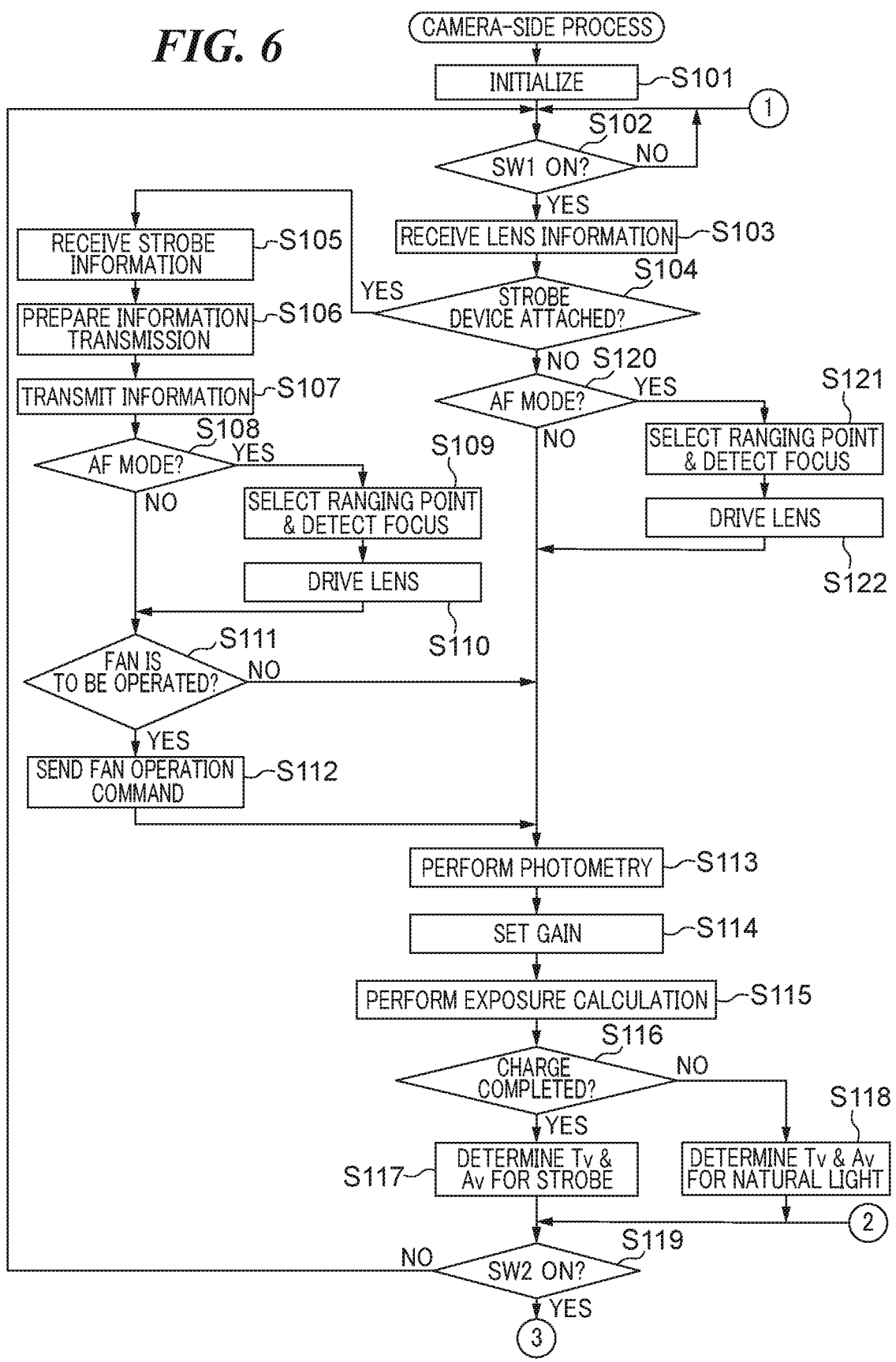
FIG. 6 is a flowchart of a camera-side process.
Figure 7:
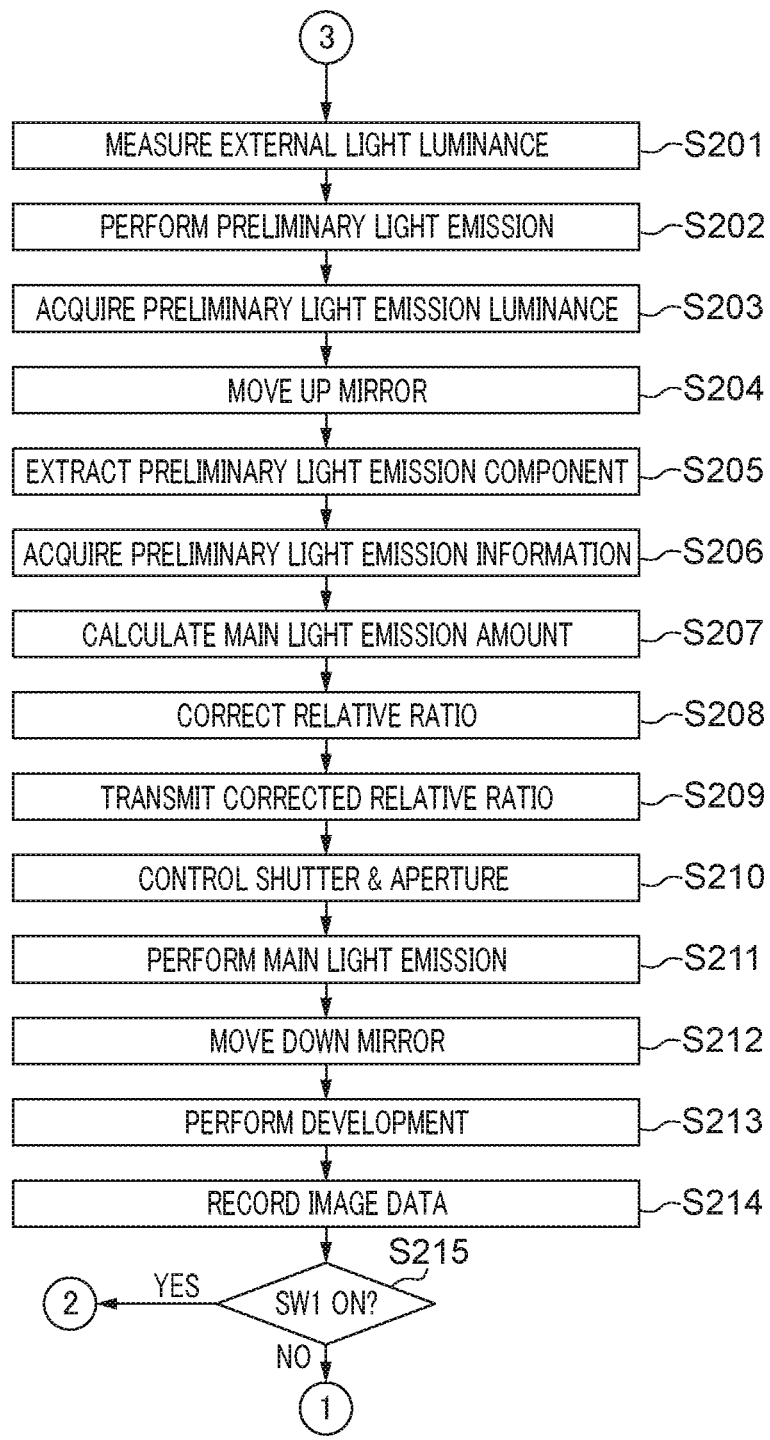
FIG. 7 is a continuation of FIG. 6.

Next, various processing processes of the camera body 100, related to the fan operation and flash shooting will be described with reference to FIGS. 6 and 7. FIGS. 6 and 7 are a flowchart of a camera-side process. This process is realized by the CPU included in the camera microcomputer 101 of the camera body 100, through loading a corresponding program stored in the ROM into the RAM, both included in the camera microcomputer 101, and executing the loaded program. This process is started when the power switch included in the input section 112 is turned on to enable the camera microcomputer 101 to operate.

In a step S101, the camera microcomputer 101 initializes a memory and ports of its own. Further, the camera microcomputer 101 reads the states of the switches included in the input section 112 and input information set in advance, and makes settings of various shooting modes, such as how to determine a shutter speed and how to determine an aperture. In a step S102, the camera microcomputer 101 waits until the release button included in the input section 112 is half-pressed to turn on the release switch SW1, and when the release switch SW1 is turned on, the camera microcomputer 101 proceeds to a step S103.

In the step S103, the camera microcomputer 101 communicates with the lens microcomputer 201 of the lens unit 200 via the communication line LC and acquires the focal distance information and optical information of the lens unit 200 necessary for the focus adjustment and photometry operations. In a step S104, the camera microcomputer 101 determines whether or not the lighting device 300 is attached to the camera body 100. If the lighting device 300 is attached to the camera body 100, the camera microcomputer 101 proceeds to a step S105, whereas if not, the camera microcomputer 101 proceeds to a step S120. Note that attachment/ unattachment of the lighting device 300 is determined based on whether or not known camera-strobe communication has been performed, and if the communication has not been performed, it is determined that the lighting device 300 is not attached, whereas if the communication has been performed, it is determined that the lighting device 300 is attached. Note that attachment of the lighting device 300 may be determined by using a known mechanical switch.

In the step S105, the camera microcomputer 101 communicates with the strobe microcomputer 310 of the lighting device 300 via the communication line SC, and acquires strobe information, such as a light ID and charge information indicating the charged state of the main capacitor 302$d$. Further, the camera microcomputer 101 transmits the focal distance information acquired in the step S103 to the strobe microcomputer 310. With this, the strobe microcomputer 310 calculates the driving amount of the zoom optical system 307 based on the received focal distance information, and moves the zoom optical system 307 based on the calculated driving amount to thereby change the irradiation range of the lighting device 300 to a range adjusted to the focal distance.

In a step S106, the camera microcomputer 101 performs preparation for transmitting information related to the lighting device 300, which is input via the input section 112, to the strobe microcomputer 310 of the lighting device 300. Here, the camera microcomputer 101 determines the input information related to the lighting device 300 and converts the information to commands to be transmitted. For example, the camera microcomputer 101 converts the information indicating the state of an on/off switch of the fan unit 340 and the release switch, and so forth, to commands. In a step S107, the camera microcomputer 101 transmits the information related to the lighting device 300, prepared to be transmitted in the step S106, to the lighting device 300.

In a step S108, the camera microcomputer 101 determines whether or not the set focus adjustment mode is an automatic focus adjustment (AF) mode. Then, if the focus adjustment mode is the automatic focus adjustment mode, the camera microcomputer 101 proceeds to a step S109, whereas if the focus adjustment mode is a manual focus adjustment (MF) mode, the camera microcomputer 101 proceeds to a step S111. In the step S109, the camera microcomputer 101 drives the focus detection circuit 107 to perform a focus detection operation using a well-known phase difference focus detection method. Further, in the step S109, in the focus adjustment, the camera microcomputer 101 selects and determines a ranging point (distance measurement point) to be focused, out of the plurality of ranging points, according to a well-known automatic selection algorithm in which the preferential selection of a close point is a basic concept, a user operation on the input section 112, or the like. In a step S110, the camera microcomputer 101 stores the ranging point determined in the step S109 in the RAM of the camera microcomputer 101. Further, in the step S110, the camera microcomputer 101 calculates the driving amount of the lens group 202 based on the focus information output from the focus detection circuit 107. Further, in the step S110, the camera microcomputer 101 communicates with the lens microcomputer 201 of the lens unit 200 via the communication line LC to move the lens group 202 based on the calculated driving amount.

In the step S111, the camera microcomputer 101 determines whether or not to execute the operation of the fan unit 340 (fan operation). Whether or not to execute the fan operation is determined based on the state of the fan switch included in the input section 112 or the input section 312, a state of the camera body 100 other than this, or the like. If it is determined that the fan unit 340 is to be operated, the camera microcomputer 101 proceeds to a step S112, whereas if it is determined that the fan unit 340 is not to be operated, the camera microcomputer 101 proceeds to a step S113. Note that in a case where the lighting device 300 performs the charge operation, the camera microcomputer 101 may determine to execute the fan operation in order to forcibly operate the cooling fan, regardless of whether or not an instruction is input to the input section 112 or 312.

In the step S112, the camera microcomputer 101 sends a command for operating the fan unit 340 to the strobe microcomputer 310 of the lighting device 300. With this, the lighting device 300 starts a fan operation process, described hereinafter with reference to FIG. 9. After that, the camera microcomputer 101 proceeds to the step S113.

In the step S120 and steps S121 and S122, the camera microcomputer 101 executes the same processing operations as in the steps S108, S109, and S110. After execution of the step S122, the camera microcomputer 101 proceeds to the step S113.

In the step S113, the camera microcomputer 101 controls the photometry circuit 106 to perform the photometry operation and acquires results of the photometry from the photometry circuit 106. For example, in a case where the photometry sensor of the photometry circuit 106 performs the photometry operation in each of the six divided areas, the camera microcomputer 101 stores luminance values of the respective areas as the acquired photometry results in the RAM as EVb(i) (i=0 to 5). In a step S114, the camera microcomputer 101 controls the gain switching circuit 108 to switch the gain according to the gain setting input via the input section 112. The gain setting refers e.g. to an ISO sensitivity setting. Further, in the step S114, the camera microcomputer 101 communicates with the strobe microcomputer 310 to transmit e.g. gain setting information indicating the switched gain to the strobe microcomputer 310.

In a step S115, the camera microcomputer 101 performs exposure calculation using a well-known algorithm based on the photometry results acquired in the step S113 (luminance values of the respective photometry areas, stored in the RAM) to determine an exposure value (EVs). In a step S116, the camera microcomputer 101 determines whether or not a charge completion signal has been received from the strobe microcomputer 310. If the charge completion signal has been received, the camera microcomputer 101 proceeds to a step S117, whereas if the charge completion signal has not been received, the camera microcomputer 101 proceeds to a step S118.

In the step S117, the camera microcomputer 101 determines exposure control values (the shutter speed (Tv) and an aperture value (Av)) suitable for flash shooting based on the exposure value calculated in the step S115, On the other hand, in the step S118, the camera microcomputer 101 determines the exposure control values suitable for non-flash shooting, without causing the lighting device 300 to emit light, based on the exposure value calculated in the step S115.

After execution of the step S117 or S118, the camera microcomputer 101 proceeds to a step S119. In the step S119, the camera microcomputer 101 determines whether or not the release button included in the input section 112 has been fully pressed to turn on the release switch SW2. If it is determined that the release switch SW2 is off, the camera microcomputer 101 returns to the step S102, whereas if it is determined that the release switch 112 is on, the camera microcomputer 101 proceeds to a step S201 in FIG. 7.

The process in the step S201 et seq. in FIG. 7 is a release process, and includes a processing process related to flash shooting. A processing process related to non-flash shooting is part of the FIG. 7 process from which a processing process for performing main light emission is omitted.

In the step S201, the camera microcomputer 101 controls the photometry circuit 106 to perform photometry in a state in which the lighting device 300 does not emit light, and acquires results of the photometry when light is not emitted (non-light emission luminance values) from the photometry circuit 106. The camera microcomputer 101 stores the acquired non-light emission luminance value of the respective areas in the RAM as EVa(i) (i=0 to 5). In a step S202, the camera microcomputer 101 sends a command for performing preliminary light emission to the strobe microcomputer 310 via the communication line SC. The strobe microcomputer 310 controls the trigger circuit 303 and the light emission control circuit 304 to perform preliminary light emission with a predetermined light amount according to this command.

In a step S203, the camera microcomputer 101 controls the photometry circuit 106 to perform the photometry operation in a state in which the lighting device 300 is performing preliminary light emission, and acquires results of the photometry (preliminary light emission luminance values) from the photometry circuit 106. Then, the camera microcomputer 101 stores the acquired preliminary light emission luminance value of the respective areas in the RAM as EVf(i) (i=0 to 5). In a step S204, the camera microcomputer 101 moves up the main mirror 104 before the exposure operation to thereby retract the main mirror 104 from the shooting optical path.

In a step S205, the camera microcomputer 101 extracts a luminance value EVdf(i) of only a reflected light component of the preliminary light emission based on the non-light emission luminance values and the preliminary light emission luminance values by using the following expression (1). This extraction processing is performed for each of the six areas (i=0 to 5).

$$EVdf(i) \leftarrow LN2(2^{\wedge}EVf(i)-2^{\wedge}Eva(i))(i=0 \text{ to } 5) \quad (1)$$

In a step S206, the camera microcomputer 101 acquires preliminary light emission information (Qpre) indicating a light emission amount at the time of preliminary light emission from the strobe microcomputer 310 via the communication line SC. In a step S207, the camera microcomputer 101 selects one of the six photometry areas which includes an object to which an appropriate amount of light should be emitted, based on the ranging points, the focal distance information, the preliminary light emission information Qpre, and the contents of the communication with the strobe microcomputer 310, and calculates a light amount for main light emission. That is, the camera microcomputer 101 calculates, with respect to the object in the selected area (P), a relative ratio r of the main light emission amount, which is appropriate with respect to the preliminary light emission amount, based on the exposure value EVs, an object luminance value Evb, and a luminance value EVdf(p) of only the reflected light component of the preliminary light emission, by using the following expression (2):

$$r \leftarrow LN2(2^{\wedge}Evs-2^{\wedge}EVb(p))-Evdf(p) \quad (2)$$

Here, a difference between the exposure value (EVs) and an expanded object luminance value (EVb) is determined, so as to control the exposure at the time of irradiating illumination light such that it becomes appropriate by a combination of the illumination light and external light.

In a step S208, the camera microcomputer 101 calculates a new relative ratio r' by correcting the relative ratio r using the shutter speed Tv at the time of flash shooting, the light emission time t_pre at the time of preliminary light emission, and a correction coefficient c set by the input section 112 in advance, by using the following expression (3):

$$r' \leftarrow r+Tv-t\_pre+c \quad (3)$$

The relative ratio r is corrected using the shutter speed Tv and the light emission time t_pre of the preliminary light emission so as to correctly compare a photometry integrated value INTp at the time of preliminary light emission and a photometry integrated value INTm at the time of main light emission.

In a step S209, the camera microcomputer 101 transmits the information related to the relative ratio r' for determining the main light emission amount to the strobe microcomputer 310 via the communication line SC. In a step S210, the camera microcomputer 101 sends a command for setting the aperture value to the aperture value Av determined in the step S117 to the lens microcomputer 201, and further controls the shutter 103 to operate at the determined shutter speed Tv.

In a step S211, the camera microcomputer 101 sends a command for executing the main light emission to the strobe microcomputer 310 via the communication line SC. With this, the strobe microcomputer 310 performs the main light emission based on the received relative ratio r'. When a series of the exposure operation is thus terminated, in a step S212, the camera microcomputer 101 moves down the main mirror 104, which has been retracted from the shooting optical path, and obliquely sets the main mirror 104 in the shooting optical path again.

In a step S213, the camera microcomputer 101 amplifies the signals output from the image capture device 102 with the gain set by the gain switching circuit 108, converts the signals to digital signals by the analog-to-digital convertor 109, and performs developing processing. Further, the camera microcomputer 101 controls the signal processing circuit 111 to perform signal processing, including white balance processing, on the converted digital signals, i.e. image data.

In a step S214, the camera microcomputer 101 stores the image data subjected to the signal processing in a storage device, such as a flash memory, not shown, and this terminates a series of shooting processing operations. In a step S215, the camera microcomputer 101 determines whether or not the release switch SW1 has been turned on. If it is determined that the release switch SW1 has been turned on, the camera microcomputer 101 returns to the step S119, whereas it is determined that the release switch SW1 has not been turned on, the camera microcomputer 101 returns to the step S102.

Figure 8:
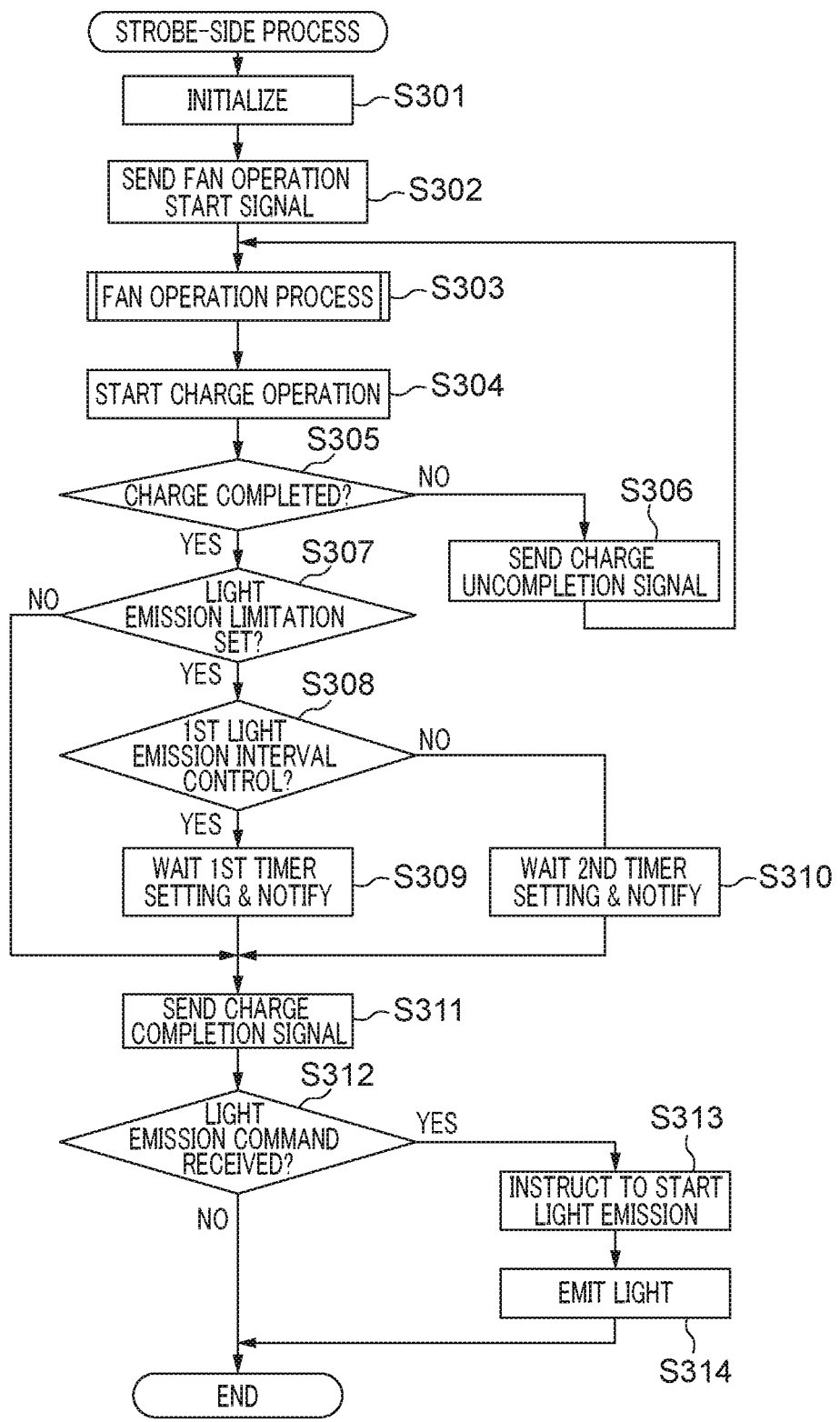
FIG. 8 is a flowchart of a strobe-side process.

Next, the control of strobe charging and light emission operation in the lighting device 300 and the fan operation process associated with the control will be described with reference to FIGS. 8 and 9. FIG. 8 is a flowchart of a strobe-side process. This process is realized by the CPU included in the strobe microcomputer 310 of the lighting device 300, through loading a corresponding program stored in the ROM into the RAM, both included in the strobe microcomputer 310, and executing the loaded program. This process is started when the power switch included in the input section 312 is turned on to enable the strobe microcomputer 310 to operate.

In a step S301, the strobe microcomputer 310 initializes a memory and a port of its own. Further, the strobe microcomputer 310 reads the states of the switches included in the input section 312, and input information set in advance, and makes settings of various light emission modes, such as the operation of the cooling fan, how to determine a light emission amount, and the light emission timing.

In a step S302, the strobe microcomputer 310 transmits a fan operation start signal to the fan unit 340 to thereby start the operation of the fan unit 340. Note that the strobe microcomputer 310 may wait for a switch operation indicating the start of the fan operation, and then transmit a fan operation start signal. In a step S303, the strobe microcomputer 310 performs the fan operation process (FIG. 9).

Figure 9:
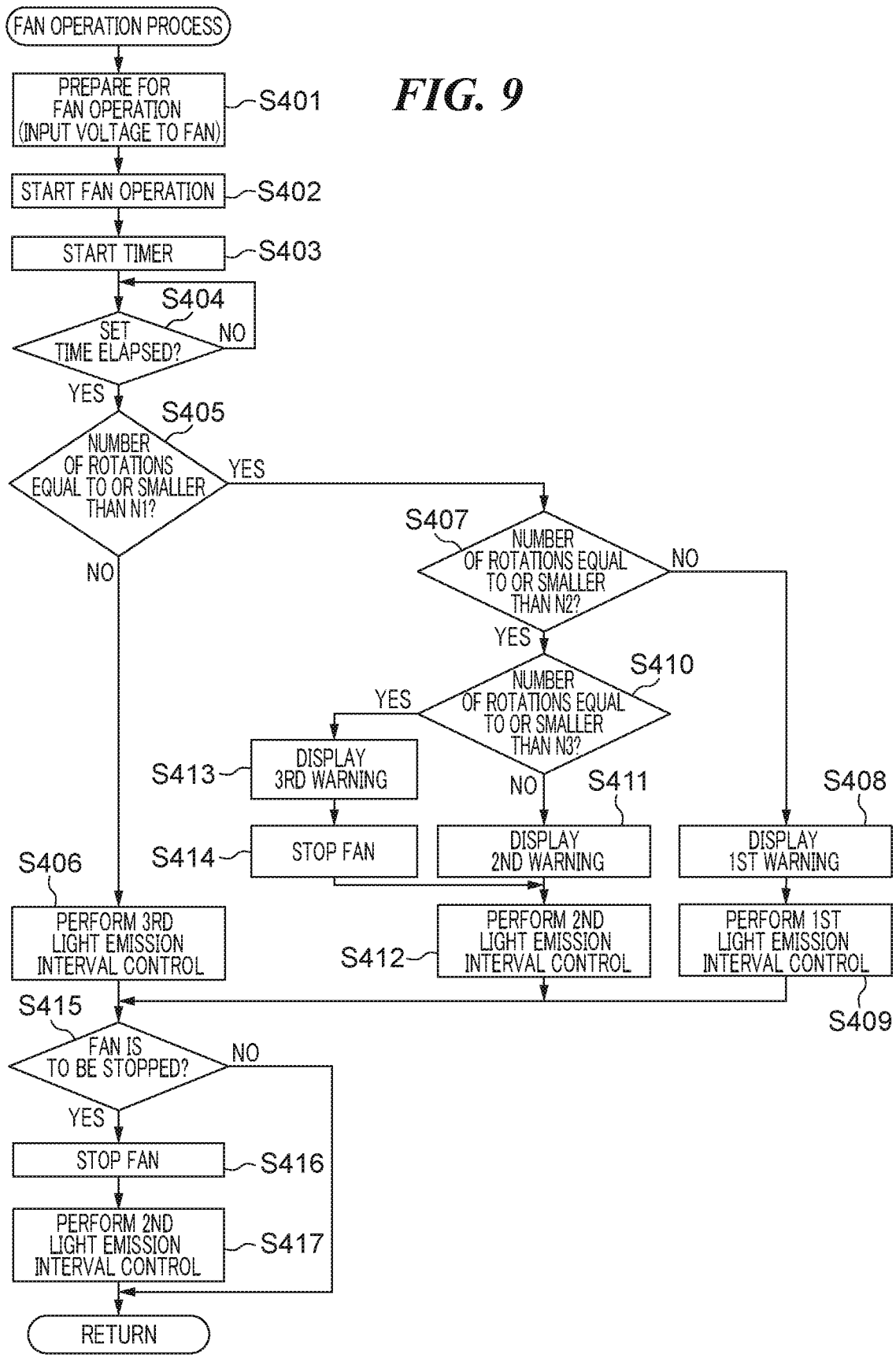
FIG. 9 is a flowchart of a fan operation process.

FIG. 9 is a flowchart of the fan operation process. This process is performed not only in the step S303, but also started in a case where the strobe microcomputer 310 receives a command for operating the fan unit 340, which is sent from the camera microcomputer 101 in the step S112, as described hereinabove.

In a step S401 in FIG. 9, the strobe microcomputer 310 performs fan operation preparation. More specifically, the strobe microcomputer 310 inputs electrical power to the motor driving section 343 of the fan unit 340. Then, in a step S402, the strobe microcomputer 310 operates the motor driving section 343 to start rotation of the propeller 342. At the same time, the pulse count detection section 345 starts processing for calculating the number of rotations of the motor 343M per unit time (motor rotation number) of the motor driving section 343 based on the rotation pulse signal input thereto. The motor rotation number is updated as time lapses, and the strobe microcomputer 310 holds the latest motor rotation number.

The strobe microcomputer 310 starts the timer in a step S403, and in a step S404, the strobe microcomputer 310 waits until a set time elapses after starting the timer. The set time is stored in the storage section, e.g. the ROM of the strobe microcomputer 310, in advance. The motor rotation number at the time of the lapse of the set time after starting the timer is compared with rotation numbers N1, N2, or N3, referred to hereinafter, Here, the strobe microcomputer 310 waits until the set time elapses, with a view to acquiring the motor rotation number in a state in which the fan operation is stabilized. When the set time has elapsed after starting the timer, the strobe microcomputer 310 proceeds to a step S405 since the set time has elapsed after starting the fan operation.

Here, the magnitude relationship between the rotation numbers N1, N2, and N3 is N1>N2>N3. The rotation number N1 is a threshold value (predetermined number of rotations) for determining whether or not the motor driving section 343 is abnormal. In a case where the motor rotation number is larger than the rotation number N1, it is determined that the motor driving section 343 is not abnormal, and in a case where the motor rotation number is equal to or smaller than the rotation number N1, it is determined that the motor driving section 343 is abnormal. The rotation number N1 is determined, by taking the durability of the motor driving section 343 into account. For example, by causing the motor driving section 343 to rotate at a rotational speed exceeding the rotation number N1, it is possible to use the motor driving section 343 for a term corresponding to a predetermined number of rotations (durability exceeding rotation number).

The rotation numbers N2 and N3 are threshold values for determining a degree of abnormality of the motor driving section 343. For example, if N1≥motor rotation number>N2 holds, it is determined that the motor driving section 343 is in a first abnormal state, if N2≥motor rotation number>N3 holds, the motor driving section 343 is in a second abnormal state, and if N3≥motor rotation number holds, the motor driving section 343 is in a third abnormal state. The degree of abnormality is in the order of the third abnormal state>the second abnormal state>the first abnormal state, and the third abnormal state is the most serious (the degree of abnormality is the most serious). The rotation number N3 is set assuming that the fan is in failure. The rotation numbers N1, N2, and N3 are stored e.g. in the ROM of the strobe microcomputer 310.

In the step S405, the strobe microcomputer 310 determines whether or not the motor rotation number is equal to or smaller than the rotation number N1 (equal to or smaller than a predetermined number of rotations). If the motor rotation number is equal to or smaller than the rotation number N1, the strobe microcomputer 310 proceeds to a step S407, whereas if the motor rotation number is larger than the rotation number N1, the strobe microcomputer 310 proceeds to a step S406. In the step S406, the strobe microcomputer 310 sets third light emission interval control without setting limitation of light emission, and then proceeds to a step S415.

Here, the light emission limitation is executed by setting a light emission interval in continuous light emission, with a view to reducing a temperature rise of the light emission section 300b caused by continuous light emission. In the present embodiment, the control of light emission limitation includes, in addition to the above-mentioned third light emission interval control in which the light emission limitation is not executed, first light emission interval control and second light emission interval control. In the first light emission interval control and the second light emission interval control, the strobe microcomputer 310 increases the light emission interval, compared with a case where it is determined that the motor driving section 343 is not abnormal. The length of the light emission interval is longer in the second light emission interval control than the first light emission interval control. The first light emission interval control and the second light emission interval control are set in the first abnormal state and the second abnormal state, respectively. The light emission interval is longer in the second light emission interval control than in the first light emission interval control because the degree of abnormality is more serious in the second abnormal state than in the first abnormal state. That is, as the degree of abnormality is more serious, there is a higher possibility that the light emission section 300b is not cooled and the temperature of the light emission section 300b excessively rises. The respective light emission intervals in the first light emission interval control and the second light emission interval control are set in advance, considering heat dissipation loss of the fan, caused by reduction of the number of rotations, and are stored e.g. in the ROM of the strobe microcomputer 310.

The strobe microcomputer 310 sets the light emission interval of the light emission section 300b in continuous light emission based on whether or not the motor driving section 343 is abnormal and the degree of abnormality, in the step S406, and steps S409 and S412, referred to hereinafter. The light emission interval control set here is reflected as a waiting time after completion of charging. For example, in the step S406, since the motor driving section 343 is not abnormal, the strobe microcomputer 310 sets the third light emission interval control. In other words, the third light emission interval control is light emission interval control in which the light emission interval is set to 0. For example, in the normal state shown in FIG. 5A, the third light emission interval control is set. Note that the third light emission interval control is not limited to the control in which the light emission interval is set to 0, but may be the control in which the light emission interval is set to a shorter time period than the light emission interval set by the first light emission interval control.

In the step S407, the strobe microcomputer 310 determines Whether or not the motor rotation number is equal to or smaller than the rotation number N2. If the motor rotation number is equal to or smaller than the rotation number N2, the strobe microcomputer 310 proceeds to a step S410, whereas if the motor rotation number is larger than the rotation number N2, the strobe microcomputer 310 proceeds to a step S408. In the step S408, since the motor driving section 343 is in the first abnormal state in which N1≥the motor rotation number>N2 holds, the strobe microcomputer 310 performs a first warning display, and sets the first light emission interval control in the step S409, For example, in the rotation number reduced state shown in FIG. 5B, the first light emission interval control is set. Note that in the first warning display in the step S408, a message that the motor rotation number is reduced is displayed on the display section 313. Then, the strobe microcomputer 310 proceeds to the step S415.

In the step S410, the strobe microcomputer 310 determines whether or not the motor rotation number is equal to or smaller than the rotation number N3. If the motor rotation number is equal to or smaller than the rotation number N3, the strobe microcomputer 310 proceeds to a step S413, whereas if the motor rotation number is larger than the rotation number N3, the strobe microcomputer 310 proceeds to a step S411. In the step S411, since the motor driving section 343 is in the second abnormal state in which N2≥the motor rotation number>N3 holds, the strobe microcomputer 310 performs a second warning display, and sets the second light emission interval control in the step S412. For example, in the rotation number abnormally reduced state shown in FIG. 5C, the second light emission interval control is set. Note that in the second warning display in the step S411, a message that the motor rotation number is abnormally reduced is displayed on the display section 313. Then, the strobe microcomputer 310 proceeds to the step S415.

In the step S413, since the motor driving section 343 is in the third abnormal state in which N3≥the motor rotation number holds, the strobe microcomputer 310 performs a third warning display. For example, in this third warning display, a message that the motor 343M or the fan is in failure is displayed on the display section 313. For example, in such a state in which failure of the fan is assumed as shown in FIG. 5D, the step S413 is executed. Next, in a step S414, the strobe microcomputer 310 stops the fan operation by shutting off the power supply to the fan unit 340. Then, the strobe microcomputer 310 proceeds to the step S412.

In the step S415, the strobe microcomputer 310 determines whether or not to stop the fan unit 340 based e.g. on a stop signal for stopping the fan unit 340. In this step S415, whether or not to stop the fan unit 340 may be determined not only based on the stop signal, but based on the temperature of the fan unit 340. For example, if it is determined, based on a result of monitoring by the temperature measurement unit 308, that the temperature of the fan unit 340 has increased to an abnormal temperature higher than a predetermined temperature, the strobe microcomputer 310 determines to stop the fan unit 340.

If it is determined in the step S415 that the fan unit 340 is to be stopped, in a step S416, the strobe microcomputer 310 shuts off the power supply to the fan unit 340 to thereby stop the operation of the fan unit 340. Note that at this time, a message that the operation of the fan unit 340 is to be stopped may be notified. Then, the strobe microcomputer 310 proceeds to a step S417. In the step S417, the strobe microcomputer 310 sets the second light emission interval control, similarly to the step S412. After that, the strobe microcomputer 310 terminates the fan operation process in FIG. 9. On the other hand, if it is not determined that the fan unit 340 is to be stopped, the strobe microcomputer 310 immediately terminates the fan operation process in FIG. 9.

After execution of the step S303 in FIG. 8, in a step S304, the strobe microcomputer 310 starts the operation of the booster circuit 302 to thereby start charging of the main capacitor 302d. In a step S305, the strobe microcomputer 310 determines whether or not the charge voltage of the main capacitor 302d has become equal to or higher than a predetermined value (charging is completed). Then, if the charge voltage of the main capacitor 302d has become equal to or higher than the predetermined value, the strobe microcomputer 310 proceeds to a step S307, whereas if the charge voltage of the main capacitor 302d is lower than the predetermined value, the strobe microcomputer 310 proceeds to a step S306. In the step S306, the strobe microcomputer 310 transmits a charge uncompletion signal to the camera microcomputer 101, and returns to the step S303.

In the step S307, the strobe microcomputer 310 determines whether or not the light emission limitation is set. More specifically, the strobe microcomputer 310 determines whether or not the first light emission interval control or the second light emission interval control is set. If the light emission limitation is not set, the strobe microcomputer 310 proceeds to a step S311. On the other hand, if it is determined in the step S307 that the light emission limitation is set, in a step S308, the strobe microcomputer 310 determines whether or not the first light emission interval control is set for the light emission limitation. If the first light emission interval control is set for the light emission limitation, the strobe microcomputer 310 proceeds to a step S309, whereas if the first light emission interval control is not set for the light emission limitation, the second light emission interval control is set, and hence the strobe microcomputer 310 proceeds to a step S310.

In the step S309, the strobe microcomputer 310 waits for a first predetermined time period (e.g. 10 seconds) which is set as the "first light emission interval timer setting", and provides a notification that the light emission interval control is to be performed until the first predetermined time period elapses using e.g. the display. Then, the strobe microcomputer 310 proceeds to the step S311, In the step S310, the strobe microcomputer 310 waits for a second predetermined time period (e.g. 30 seconds) which is set as the "second light emission interval timer setting", and provides a notification that the light emission interval control is to be performed until the second predetermined time period elapses e.g. using the display. Then, the strobe microcomputer 310 proceeds to the step S311. Note that the first predetermined time period and the second predetermined time period are stored e.g. in the ROM of the strobe microcomputer 310 in advance. Although the first predetermined time period and the second predetermined time period are not limited to the exemplified values, the lengths of these time periods are defined as the first predetermined time period<the second predetermined time period.

In the step S311, the strobe microcomputer 310 transmits the charge completion signal to the camera microcomputer 101, and proceeds to a step S312. In the step S312, the strobe microcomputer 310 determines whether or not a light emission start signal has been received from the camera microcomputer 101 as a light emission command. Then, if the light emission start signal has not been received, the strobe microcomputer 310 terminates the strobe-side process in FIG. 8. In this case, light emission is not performed. On the other hand, if the light emission start signal has been received, in a step S313, the strobe microcomputer 310 instructs the light emission control circuit 304 to start light emission according to the received light emission start signal. In a step S314, the strobe microcomputer 310 controls the light emission control circuit 304 to emit light from the discharge tube 305 according to the light emission start instruction. After that, the strobe microcomputer 310 terminates the strobe-side process in FIG. 8.

In a case where the process proceeds from the step S307 to the step S311, since the light emission limitation is not set, the charge completion signal is immediately transmitted. Therefore, substantially, light emission is performed with no light emission interval or a short light emission interval from the preceding light emission. On the other hand, in a case where the process proceeds from the step S309 or S310 to the step S311, since the light emission limitation is set, light emission is performed after forcibly maintaining the time interval of the first predetermined time period or the second predetermined time period. This increases the light emission interval and thereby makes it possible to relieve the temperature rise of the light emission section 300b.

Note that the above-described flowcharts are shown by way of example, and hence the steps may be executed in a different order from the above-described example insofar as there is no inconvenience.

According to the present embodiment, the strobe microcomputer 310 determines whether or not the motor driving section 343 is abnormal by determining whether or not the motor rotation number is equal to or smaller than the rotation number N1. The strobe microcomputer 310 controls the light emission interval of the light emission section 300*b* in continuous light emission based on a result of the determination of whether or not the motor driving section 343 is abnormal (whether or not abnormal and a degree of abnormality). More specifically, when the motor driving section 343 is abnormal, the strobe microcomputer 310 makes the light emission interval of the light emission section 300*b* longer than that set when the motor driving section 343 is not abnormal (S409, S412, S309, and S310). With this, even when the fan unit 340 is incapable of normal rotation, it is possible to suppress an excessive temperature rise of the light emission section 300*b*.

Further, the strobe microcomputer 310 determines the degree of abnormality of the motor driving section 343 by classifying the same into a plurality of levels, and differentiates the light emission interval of the light emission section 300*b* in continuous light emission, for each level of abnormality (S309 and S310). More specifically, as the degree of abnormality is higher, the light emission interval in continuous light emission is made longer. With this, it is possible to realize both of light emission and prevention of a temperature rise, according to the degree of abnormality.

Further, in a case where the degree of abnormality of the motor driving section 343 is included in a level (defined according to numbers of rotations equal to or smaller than N3) which is more serious than a predetermined level (defined according to numbers of rotations equal to or smaller than N2 and larger than N3) out of the plurality of levels, the strobe microcomputer 310 stops rotation of the propeller 342 driven by the motor driving section 343 (S414). With this, in a case where a serious abnormality has occurred, it is possible to suppress further generation of heat by the fan unit 340 and avoid a serious failure. Further, in a case where the temperature of the fan unit 340 exceeds a predetermined temperature, the strobe microcomputer 310 stops rotation of the propeller 342 driven by the motor driving section 343, regardless of a result of the determination of whether or not the motor driving section 343 is abnormal (S416). With this, even when the temperature excessively rises, it is possible to suppress further generation of heat by the fan unit 340 and avoid a serious failure.

Further, the strobe microcomputer 310 determines, when the set time has elapsed after starting driving of the propeller 342, whether or not the motor driving section 343 is abnormal (S404). With this, it is possible to acquire the motor rotation number in a state in which the fan operation is stabilized, and improve the abnormality determination accuracy.

Further, in a case where it is determined that the motor driving section 343 is abnormal, the strobe microcomputer 310 notifies a user of this fact (S408, S411, and S413), and hence it is possible to notify the user of occurrence of abnormality of the motor driving section 343. The warning display performed in the steps S408, S411, and S413 may be display of a warning icon prepared in advance in the display section 313, or may be pop-up display. Further, the degree of abnormality may be notified by a message contents of which are differentiated for each level of abnormality. Further, the method of notification in the steps S408, S411, and S413 is not limited to the method using display, but may be a method using voice.

Figure 5:
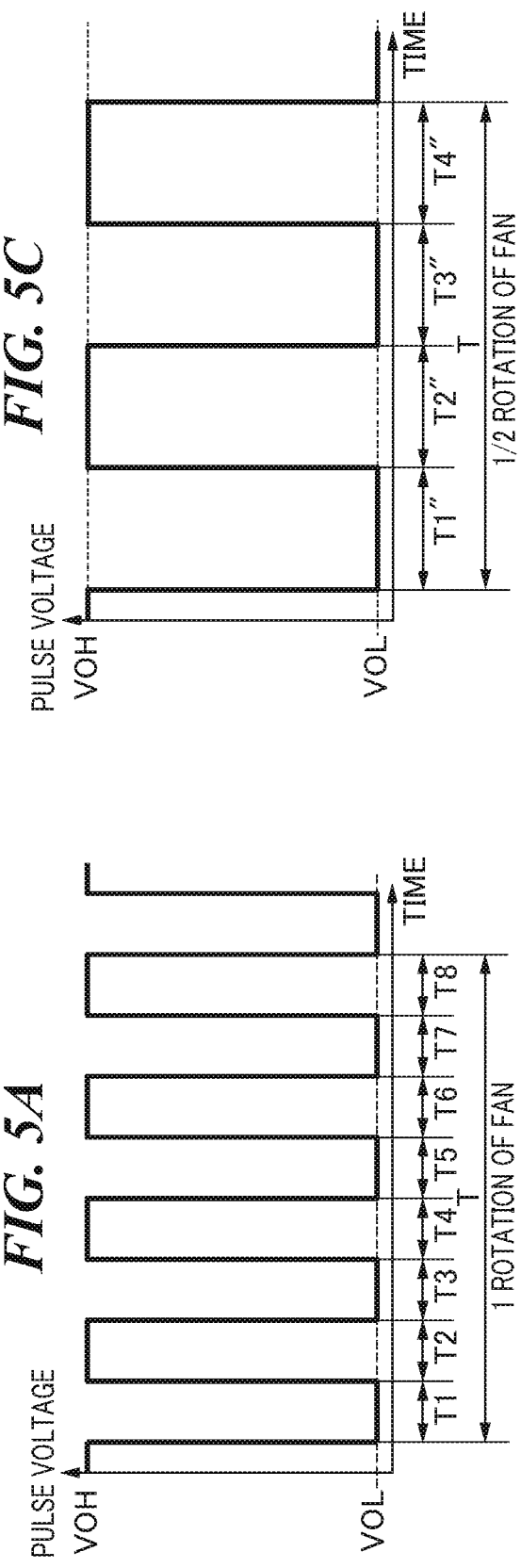
FIGS. 5A to 5D are diagrams each showing changes in a rotation pulse signal input to the strobe microcomputer.

Next, a description will be given of a second embodiment of the present invention with reference to FIGS. 10, 11, and 12 in place of FIGS. 4, 5, and 9 of the first embodiment.

Figure 10:
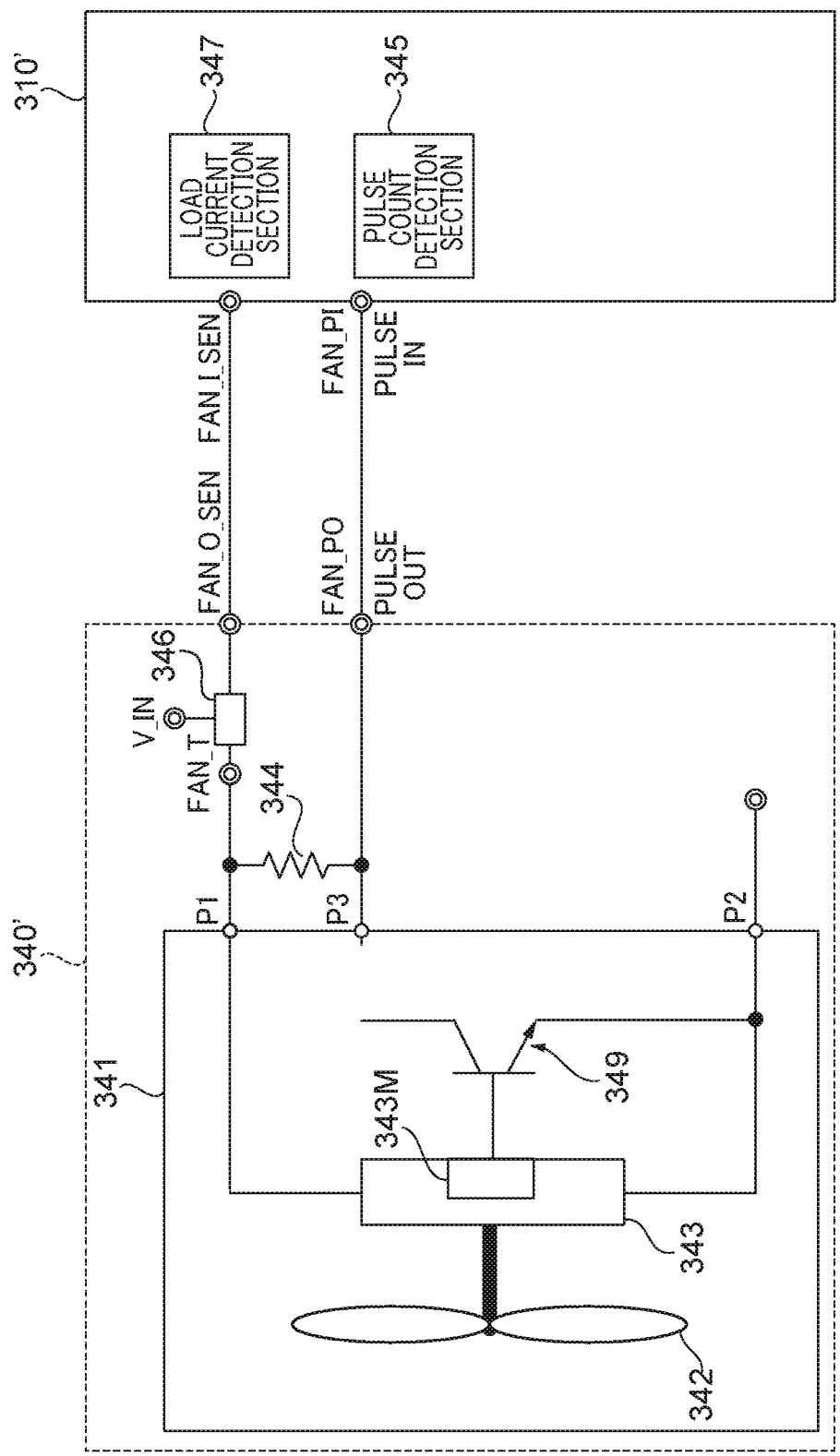
FIG. 10 is a circuit block diagram of a fan unit, shown together with a strobe microcomputer, in block diagram, of a lighting device according to a second embodiment of the present invention.

FIG. 10 is a circuit block diagram of a fan unit 340', shown together with a strobe microcomputer 310', in block diagram, of a lighting device 300' (not shown) according to a second embodiment of the present invention. The strobe microcomputer 310' has a FAN_I_SEN terminal, and includes a load current detection section 347. Further, the fan unit 340' has a FAN_O_SEN terminal and includes a voltage level output section 346 that detects a load current of the motor driving section 343. Other components are the same as those of the first embodiment. In the present embodiment, light emission limitation is set based on a power supply current input to the fan unit 340'.

The voltage level output section 346 is connected between the power terminal, to which the power supply V_IN is input, and the terminal FAN_T. The voltage level output section 346 includes a resistor, an analog-to-digital convertor, and a comparator, none of which are specifically shown. The voltage level output section 346 converts, for example, an amount of electrical current of the power supply V_IN input from the power terminal, to a voltage level. The voltage level is input from the FAN_O_SEN terminal to the strobe microcomputer 310' via the FAN_I_SEN terminal of the strobe microcomputer 310'. The load current detection section 347 includes an analog-to-digital convertor and a comparator, none of which are specifically shown, and detects a load current from the input voltage level. With this, the strobe microcomputer 310' acquires the load of the motor driving section 343.

FIGS. 11A to 11D are diagrams each showing changes in the level of the voltage input to the strobe microcomputer 310', In each diagram, the vertical axis represents an output from the FAN_O_SEN terminal (voltage level) and the horizontal axis represents time (Time In FIGS. 11A to 11D, the horizontal axis is the same as that indicated in FIGS. 5A to 5D.

When the power supply current is input to the fan unit 340', a lower limit value of the voltage level is a SEN_L level in each of the states shown in FIGS. 11A to 11D, An upper limit value of the voltage level is a SEN_H level, a SEN_H1 level, a SEN_H2 level, and a SEN_H3 level in FIGS. 11A, 11B, 11C, and 11D, respectively. As the load of the motor driving section 343 is larger, the upper limit value of the voltage level is higher. The magnitude relationship of these upper limit values of the voltage level is expressed by SEN_H<SEN_H1<SEN_H2<SEN_H3. Therefore, FIG. 11A shows a normal state, and the magnitude relationship of the loads is expressed by FIG. 11A<FIG. 11B<FIG. 11C<FIG. 11D. The load is the highest in the state shown in FIG. 11D.

Figure 12:
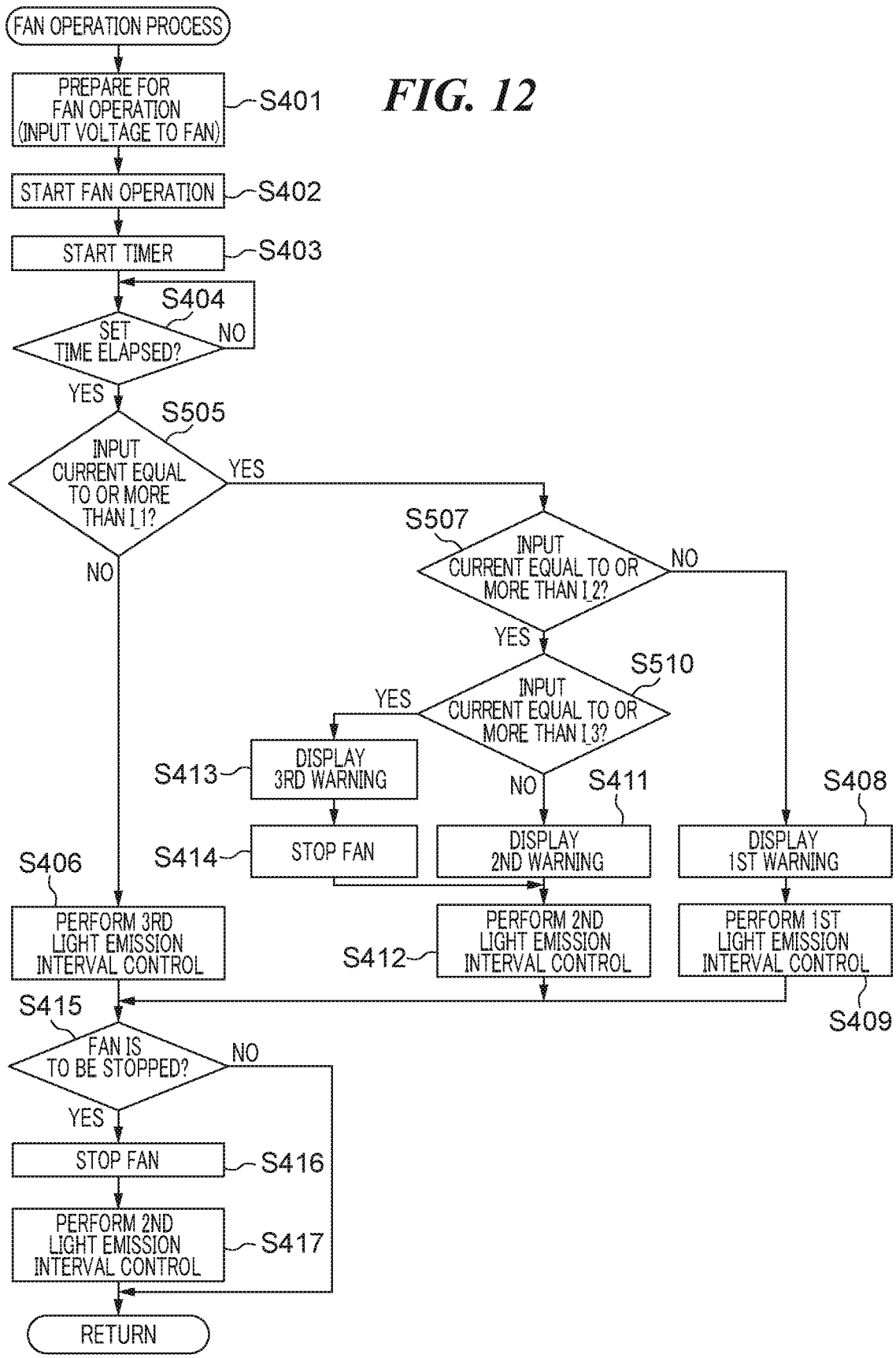
FIG. 12 is a flowchart of a fan operation process.

FIG. 12 is a flowchart of a fan operation process. The executing entity and the start condition of this process are the same as those of the fan operation process in FIG. 9. The flowchart in FIG. 12 includes steps S505, S507, and S510 in place of the steps S405, S407, and S410 in FIG. 9. Other steps are the same as those in FIG. 9.

A value I_1, a value I_2, and a value I_3, mentioned in the following description, correspond, when converted to voltages, to the SEN_H1 level (FIG. 11B), the SEN_H2 level (FIG. 11C), and the SEN_H3 level (FIG. 11D), respectively. Here, the magnitude relationship between the values I_1, I_2, and I_3 is expressed by I_1<I_2<I_3. The value I_1 is a threshold value for determining whether or not the motor driving section 343 is abnormal. In general, when the number of times of use is increased, the load on the motor driving section becomes heavier, and the power supply current flows more than usual, and hence the input current can be used for determination of a degree of abnormality. If the electrical current input to the fan unit 340' is less than the value I_1, it is determined that the motor driving section 343 is not abnormal, and if the input electrical current is equal to or more than the value I_1, it is determined that the motor driving section 343 is abnormal. The value I_1 is determined by taking the durability of the motor driving section 343 into account. For example, in a state in which the input electrical current is less than the value I_1, it is possible to use the motor driving section 343 a term corresponding to a predetermined number of rotations (durability exceeding rotation number).

The values I_2 and I_3 are threshold values for determining a degree of abnormality of the motor driving section 343. For example, if I_1≤input electrical current<I_2 holds, it is determined that the motor driving section 343 is in the first abnormal state, if I_2≤input electrical current<I_3 holds, the motor driving section 343 is in the second abnormal state, and if I_3≤input electrical current holds, the motor driving section 343 is in the third abnormal state. The degree of abnormality is in the order of the third abnormal state>the second abnormal state>first abnormal state, and the third abnormal state is the most serious. The value I_3 is set assuming that the fan is in failure. The values I_1, I_2, and I_3 are stored e.g. in the ROM of the strobe microcomputer 310'.

In the step S505, the strobe microcomputer 310' determines whether or not the electrical current input to the fan unit 340' is equal to or more than the value I_1 (equal to or more than the threshold value). Then, if the input electrical current is equal to or more than the value I_1, the strobe microcomputer 310' proceeds to the step S507, whereas if the input electrical current is less than the value I_1, the strobe microcomputer 310' proceeds to the step S406.

In the step S507, the strobe microcomputer 310' determines whether or not the electrical current input to the fan unit 340' is equal to or more than the value I_2. Then, if the input electrical current is equal to or more than the value I_2, the strobe microcomputer 310' proceeds to a step S510, whereas if the input electrical current is less than the value I_2, the strobe microcomputer 310' proceeds to the step S408.

In the step S510, the strobe microcomputer 310' determines whether or not the electrical current input to the fan unit 340' is equal to or more than the value I_3. Then, if the input electrical current is equal to or more than the value I_3, the strobe microcomputer 310' proceeds to the step S413, whereas if the input electrical current is less than the value I_3, the strobe microcomputer 310' proceeds to the step S411.

According to the present embodiment, the strobe microcomputer 310' acquires the load of the motor driving section 343 from the electrical current input to the fan unit 340', and determines based on the acquired load whether or not the motor driving section 343 is abnormal. Then, the strobe microcomputer 310' controls the light emission interval of the light emission section 300b in continuous light emission based on a result of the determination of whether or not the motor driving section 343 is abnormal (whether or not abnormal and a degree of abnormality).

Therefore, even when the fan unit 340' ceases to normally rotate, it is possible to obtain the same advantageous effects as provided by the first embodiment in suppressing an excessive temperature rise of the light emission section 300b.

Note that the method of acquiring the load of the motor driving section 343 is not limited to above-described example. For example, the torque of the motor 343M of the motor driving section 343 may be detected.

Note that although in the above-described embodiments, the degree of abnormality is classified into the three levels, it is only required to classify the degree of abnormality into at least a normal level and an abnormal level, and the degree of abnormality may be divided into four or more levels.

Note that the present invention can also be applied to an image capture apparatus integrating a lighting device and a camera body. Further, the present invention can also be applied to an image capture apparatus integrating a lighting device, a camera body, and a lens unit. When applying the present invention to these apparatuses, each control performed by the strobe microcomputer 310 or 310' may be performed by the camera microcomputer 101.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-026683 filed Feb. 18, 2019, which is hereby incorporated by reference herein in its entirety.

What is claimed is:

1. A lighting device comprising:
a light emission section configured to emit light for illuminating an object;
a fan configured to cool the light emission section;
a drive unit configured to include a motor and drive the fan for rotation;
at least one memory that stores a set of instructions; and
at least one processor that executes the instructions, the instructions, when executed, causing the lighting device to perform operations comprising:
determining whether or not the drive unit is abnormal; and
controlling a light emission interval of the light emission section in continuous light emission, based a result of said determining,
wherein in a case where it is determined that the drive unit is abnormal, the light emission interval of the light emission section in continuous light emission is made longer than in a case where it is determined that the drive unit is not abnormal.

2. The lighting device according to claim 1, wherein in a case where it is determined that the drive unit is abnormal, the light emission interval of the light emission section in continuous light emission is controlled by setting a waiting time until light emission from the light emission section is started, after completion of charging for light emission from the light emission section.

3. The lighting device according to claim 1, wherein a degree of abnormality of the drive unit is determined in a plurality of levels; and
wherein the light emission interval of the light emission section in continuous light emission is differentiated for each level of abnormality of the drive unit.

4. The lighting device according to claim 3, wherein as the degree of abnormality of the drive unit is higher, the light emission interval of the light emission section in continuous light emission is made longer.

5. The lighting device according to claim 3, wherein in a case where the degree of abnormality of the drive unit belongs to one of the plurality of levels, which is more serious than a predetermined level, driving of the fan by the drive unit is controlled to be stopped.

6. The lighting device according to claim 1, wherein after lapse of a set time from the start of driving of the fan by the drive unit, whether or not the drive unit is abnormal is determined.

7. The lighting device according to claim 1, further comprising a detection unit configured to detect a temperature of the fan, and
wherein in a case where a temperature detected by the detection unit is higher than a predetermined temperature, driving of the fan by the drive unit is controlled to be stopped regardless of a result of said determining.

8. The lighting device according to claim 1, wherein in a case where it is determined by said determining that the drive unit is abnormal, information which indicates that the drive unit is abnormal is notified.

9. The lighting device according to claim 1, wherein the operations further comprise acquiring the number of rotations of the drive unit, and
wherein said determining includes determining whether or not the drive unit is abnormal, based on the acquired number of rotations.

10. The lighting device according to claim 1, wherein in a case where the acquired number of rotations is equal to or smaller than a predetermined number, it is determined that the drive unit is abnormal.

11. The lighting device according to claim 1, wherein the operations further comprise acquiring a load of the drive unit, and
wherein said determining includes determining whether or not the drive unit is abnormal, based on the acquired load.

12. The lighting device according to claim 11, wherein in a case where the acquired load is equal to or higher than a threshold value, it is determined that the drive unit is abnormal.

13. An image capture apparatus including:
a lighting device, and
an image capture section having an image capture function,
the lighting device comprising:
a light emission section configured to emit light for illuminating an object;
a fan configured to cool the light emission section;
a drive unit configured to include a motor and drive the fan for rotation;
at least one memory that stores a set of instructions; and
at least one processor that executes the instructions, the instructions, when executed, causing the lighting device to perform operations comprising:
determining whether or not the drive unit is abnormal; and
controlling a light emission interval of the light emission section in continuous light emission, based a result of said determining,
wherein in a case where it is determined that the drive unit is abnormal, the light emission interval of the light emission section in continuous light emission is made longer than in a case where it is determined that the drive unit is not abnormal.

14. A method of controlling a lighting device including a light emission section configured to emit light for illuminating an object, a fan configured to cool the light emission section, and a drive unit configured to include a motor and drive the fan for rotation, comprising:
determining whether or not the drive unit is abnormal; and
controlling a light emission interval of the light emission section in continuous light emission, based a result of said determining,
wherein in a case where it is determined that the drive unit is abnormal, the light emission interval of the light emission section in continuous light emission is made longer than in a case where it is determined that the drive unit is not abnormal.

* * * * *